(12) United States Patent
Kamins et al.

(10) Patent No.: US 7,391,109 B2
(45) Date of Patent: Jun. 24, 2008

(54) INTEGRATED CIRCUIT INTERCONNECT

(75) Inventors: Theodore I. Kamins, Palo Alto, CA (US); Philip J. Kuekes, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 35 days.

(21) Appl. No.: 11/438,167

(22) Filed: May 22, 2006

(65) Prior Publication Data

US 2007/0284734 A1    Dec. 13, 2007

(51) Int. Cl.
*H01L 21/50* (2006.01)
(52) U.S. Cl. ............................. 257/723; 257/213
(58) Field of Classification Search ............ 257/723, 257/213, 241, 265, 347
See application file for complete search history.

(56) References Cited

U.S. PATENT DOCUMENTS

| 4,479,297 A | 10/1984 | Mizutani et al. |
| 4,570,175 A | 2/1986 | Miyao et al. |
| 5,095,347 A | 3/1992 | Kirsch |
| 5,428,238 A | 6/1995 | Hayashi et al. |
| 6,294,829 B1 * | 9/2001 | Liu ............................. 257/723 |

FOREIGN PATENT DOCUMENTS

| JP | 60246654 | 12/1985 |
| JP | 63102264 | 5/1988 |

* cited by examiner

*Primary Examiner*—Roy Potter

(57) ABSTRACT

An embodiment of an integrated circuit comprises active components in more than one active layer. A first conductor in one active layer is operative to produce a static electric field that controls a first active element in an adjacent active layer.

16 Claims, 4 Drawing Sheets

INTEGRATED CIRCUIT INTERCONNECT

FIELD OF THE INVENTION

The invention relates to integrated circuits, and especially to coupling of signals between layers in a three-dimensional integrated circuit.

BACKGROUND

Integrated circuit (IC) devices typically contain a large number of active elements such as transistors forming a layer on a semiconductor die. The size and complexity of IC devices has increased over time, and the problems of efficient routing of signals from one element to another have increased accordingly.

Three-dimensional IC (3D-IC) devices have been proposed in which the active elements are arranged in more than one superimposed layer. 3D-IC devices are attractive because the third dimension allows greater freedom of design and can allow considerable reductions in signal path lengths. For certain applications, the more compact shape that can be achieved is desirable, and allows a robust device with a smaller, thinner, and lighter substrate than would be necessary for a comparable single-layer device.

Signals may be transferred from one layer to another layer in a 3D-IC by conductive vias extending through the layers. A via may consist of a hole through a silicon layer, lined with insulator and filled with metal. The 3D-IC device may then be fashioned by fabricating the layers separately, and stacking the layers so that exposed contacts on adjacent layers mate to establish electrical communication with the vias.

Forming vias passing vertically through the layers of silicon adds complexity to the fabrication process. The tolerances required for the etching process can limit the density of devices and other circuit components on the layers concerned. In addition, the electrical resistance of the vias, and their capacitive interaction with adjacent circuit components, can materially restrict the circuit design. In particular, RC time constants can restrict the speed of operation of circuits including such vias.

SUMMARY

According to one embodiment of the present invention, there is provided an integrated circuit comprising active devices in more than one active layer, wherein at least one first active device comprises a first conductor in one active layer and a first active element in an adjacent active layer, wherein the at least one first conductor is operative to produce a static electric field that controls the first active element.

According to another embodiment of the present invention, there is provided a three-dimensional integrated circuit comprising transistors in more than one active layer, and further comprising at least one field-effect transistor of which the gate and the channel are in different active layers.

According to one embodiment of the present invention, there is provided a method of making an integrated circuit, comprising forming a first active layer comprising at least one first element selected from the group consisting of gates and channels, applying over the first active layer an insulating region, and applying over the insulating region a second active layer comprising at least one second element overlying the at least one first element and selected from the group consisting of channels and gates, wherein the at least one first element and the overlying at least one second element comprise a channel and a gate operative to control that channel.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Reference will now be made in detail to various embodiments of the present invention, example of which is illustrated in the accompanying drawings.

Figure 1:
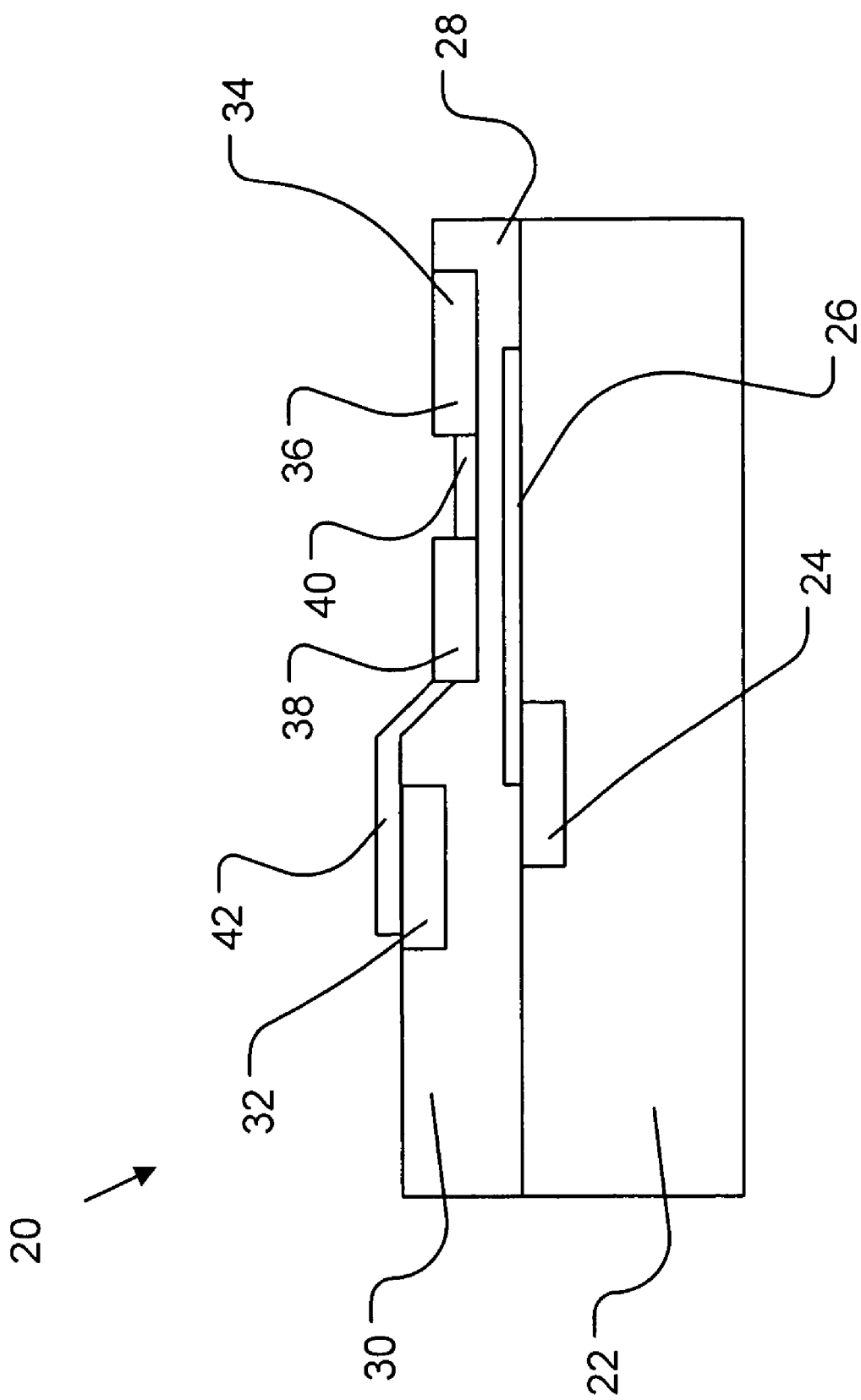
FIG. 1 is a somewhat schematic cross section through a first form of 3D-IC device in accordance with an embodiment of the present invention.

Referring initially to FIG. 1, a first embodiment of a three-dimensional (3D-IC) device, indicated generally by the reference numeral 20, comprises a substrate 22, which may be of silicon or other semiconductor material, on which is formed a layer of transistors or other active components, one of which is shown symbolically at 24. A conductor 26 carrying an output signal voltage from the active component 24 is formed at the surface of the substrate 22.

The substrate 22, including the active component 24 and the conductor 26, is covered with an insulating region 28.

On top of the insulating region 28 is formed a further layer 30 of transistors or other active devices and elements, one of which is shown symbolically at 32. The active elements in the further layer include a source 36 and a drain 38 connected by a channel 40, which together form part of a field effect transistor (FET) indicated generally by the reference number 34. The source 36 and/or drain 38 are connected to other active devices 32 in the further active layer 30 by conductive pathways 42.

The FET 34 is positioned so that the channel 40 can be affected by an electrostatic field from the signal voltage in the conductor 26, which serves as the gate electrode for the FET 34. In the embodiment shown in FIG. 1, the thickness of the insulating region 28 between the conductor 26 and the channel 40 is smaller than the thickness of the insulating region 28 between other parts of the layers 22 and 30. A signal voltage from active component 24 in the first layer 22 can thus be transmitted to active device 32 in the second layer 30 by the field effect from the gate electrode conductor 26 to the channel 40 of the FET 34.

Figure 2:
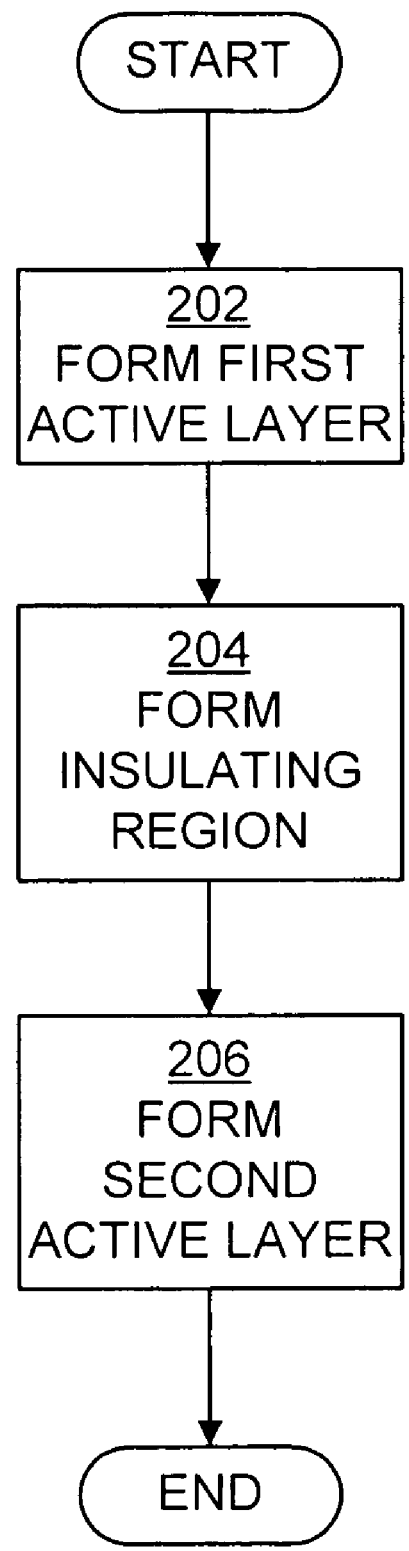
FIG. 2 is a flowchart showing one embodiment of a method of making a device according to FIG. 1.

Referring now to FIG. 2, which illustrates one embodiment of a method for forming a 3D-IC, in step 202 a first active layer of devices 24, including the conductor 26, is formed on substrate 22. The first active layer may be formed by a suitable process, including conventional processes, and in the interests of conciseness the process of forming the first active layer is not described in detail.

In step 204, an insulating region 28 is formed over the first active layer 22, 24, 26. The part of the insulating region 28 between the gate electrode 26 and the channel 40 is formed appropriately so that the field from the gate electrode 26 has the desired effect on the channel 40.

In step 206, the second active layer 30, 32, 42, including the source 36 and the drain 38, connected by the channel 40, is formed on top of the insulating region 28.

Figure 3:
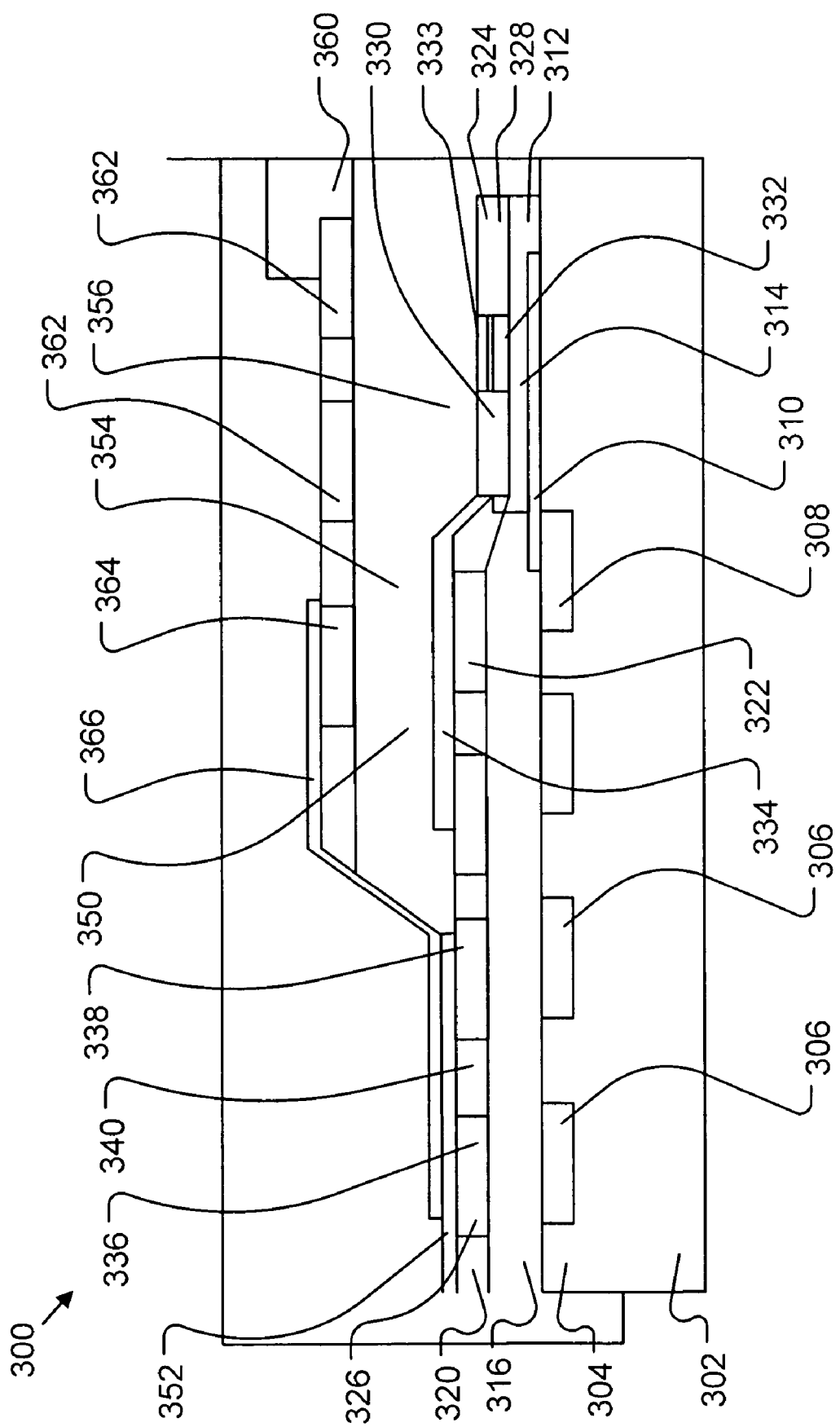
FIG. 3 is a somewhat schematic cross section through a second form of 3D-IC device in accordance with an embodiment of the present invention.

Referring now to FIG. 3, a second embodiment of a 3D-IC according to an embodiment of the invention, indicated generally by the reference number 300, comprises a substrate layer 302, which may be of silicon or other semiconductor material, on which is formed a first active layer 304 comprising transistors or other active devices, some of which are shown symbolically at 306, 308. A conductor 310 carrying an output signal voltage from the active device 308 is formed at the surface of the first substrate layer 302. Similar to the conductor 26 described above with reference to FIG. 1, the conductor 310 is the gate electrode for an FET 324 to be described below. The devices and other components 306, 308, 310 of the first active layer 304 may be formed above, below, or straddling the general surface layer of the substrate layer 302, as is appropriate in a particular case.

The first active layer 304 of the substrate layer 302 is covered with a first insulating region 312. The first insulating region 312 has a first part 314 over at least a portion of the gate electrode 310 that allows an electric field from a signal voltage in the gate electrode 310 to penetrate into a space above the first part 314 of the first insulating region 312. The first insulating region 312 has a second part 316 that effectively isolates a space above the second part 316 of the first insulating region 312 from the first active layer 304. As shown in FIG. 3, the first part 314 of the first insulating region 312 is thinner than the second part 316. Alternatively, or in addition, the first part 314 may have a higher permittivity than the second part 316. In an embodiment, both the first part 314 and the second part 316 are of silicon dioxide ($SiO_2$) with a relative permittivity $\epsilon_r \approx 4$. The first part 314 may then be from 2 to 10 nm thick, for example, around 5 nm thick, and the second part 316 may then be 200 nm to 1 μm thick, for example, around 500 nm thick. In another embodiment, the first part 314 may be $HfO_2$, with a relative permittivity $\epsilon_r \approx 20$, and may be from 3 to 30 nm thick, for example, around 10 nm thick. In another embodiment, the second part 316 may be of a Si—O—C material with a relative permittivity $\epsilon_r \approx 3$.

On top of the first insulating region 312 is formed a second active layer 320 of transistors or other active devices 322, only some of which are shown in FIG. 3. The second active layer 320 includes a source 328 and a drain 330 connected by a channel 332 that, together with the gate electrode 310 in the first active layer 304, form the FET 324. The source 328 and/or drain 330 are connected to other active devices 322 in the second active layer 320 by conductive pathways 334. The second active layer 320 includes a source 336 and a drain 338 connected by a channel 340 that form part of an FET 326. As shown in FIG. 3, the FET 324 has an upper gate 333 connected to active devices 322 by a conductor (not shown) similar to conductor 310, 334. The upper gate 333 is insulated from the channel 332 by an insulating layer. Alternatively, the FET 326 may not have a gate electrode in the second active layer 320. The source 336 and/or drain 338 may be connected to other active devices 322 in the second active layer 320 by conductive pathways 334.

The channel 332 of the FET 324 is positioned on the first part 314 of the first insulating region 312 so that the channel 332 can be affected by an electrostatic field from the signal voltage in the gate electrode 310. A signal voltage from an active device 308 or element in the first active layer 304 can thus be transmitted to an active device 322 or element in the second active layer 320 by the field effect from the gate electrode 310 to the channel 332 of the FET 324.

A signal is thus transmitted between active layers without requiring vias through either active layer 304, 320 or through the first insulating region 312, and without any special signal transmission circuitry. With suitable circuit design and fabrication the FET 324 may provide gain, so that the signal is transmitted from device 308 to device 322 unattenuated, or even amplified. The FET 324 may be an operative circuit device, rather than simply a device for relaying a signal from layer to layer. By placing the gate electrode 26, 310, etc. close to the output of the preceding circuitry 24, 308, etc. and the output 42, 334 of the FET 34, 324 close to the subsequent circuitry 32, 322, etc., the series resistance of the connection can be limited. This can enable a connection with high bandwidth, low power consumption, and a high bandwidth/power ratio. The use of a purely capacitive connection can significantly reduce or even eliminate the large RC time constants sometimes found when using vias for data transfer.

The upper gate 333 of FET 324 may be a control gate serving to enable or disable the signal transmission from active layer 304 to active layer 320. Alternatively, or in addition, the second gate electrode 333 may bias the channel 332 to compensate for any mismatch between layers, for example, for voltage translation or to compensate for process variations or non-optimum work functions, or may be used for any other purpose for which an FET may be provided with more than one gate.

Over the second active layer 320 is formed a second insulating region 350. The second insulating region 350 has a first part 352 formed over the channel 340 of the FET 326. The first part 352 of the second insulating region 350 may be similar to the first part 314 of the first insulating region 312. The second insulating region 350 has a second part 354 formed over other parts of the second active layer 320. The second part 354 of the second insulating region 350 may be similar to the second part 316 of the first insulating region 312, and serves to isolate a space above the second part 316 from the second active layer 320. The second part 354 of the second insulating region 350 includes a thicker region 356 over the FET 324, to compensate for the thinness of the first part 314 of the first insulating region 312, and keep the top surface of the second part 354 of the second insulating region 350 more or less even. In a 3D-IC with many layers 304, 320, etc., depending on the positioning of the insulating region first parts 314, 352 in different layers, thicker regions 356 may be provided or omitted as appropriate. Alternatively or in addition, a thicker region 356 may be formed under a region where an insulating region first part 314, 352 is to be formed in a subsequent layer.

Over the second insulating region 350 is a third active layer 360, which comprises active devices 362, 364. A conductor 366 extends from the active device 364 over the first part 352 of the second insulating region 350, and carries a signal voltage from the active device 364 to a position where the conductor 366 or an adjacent conducting or semiconducting layer acts as the gate electrode for the underlying channel 340 of the FET 326 below. In an embodiment, the conductor 366 may be of metal and the actual gate electrode may be a polysilicon conducting layer. The FET 326 thus acts similarly to the FET 324, but to transmit signals from a starting layer to a layer below the starting layer instead of to a layer above the starting layer.

Figure 4:
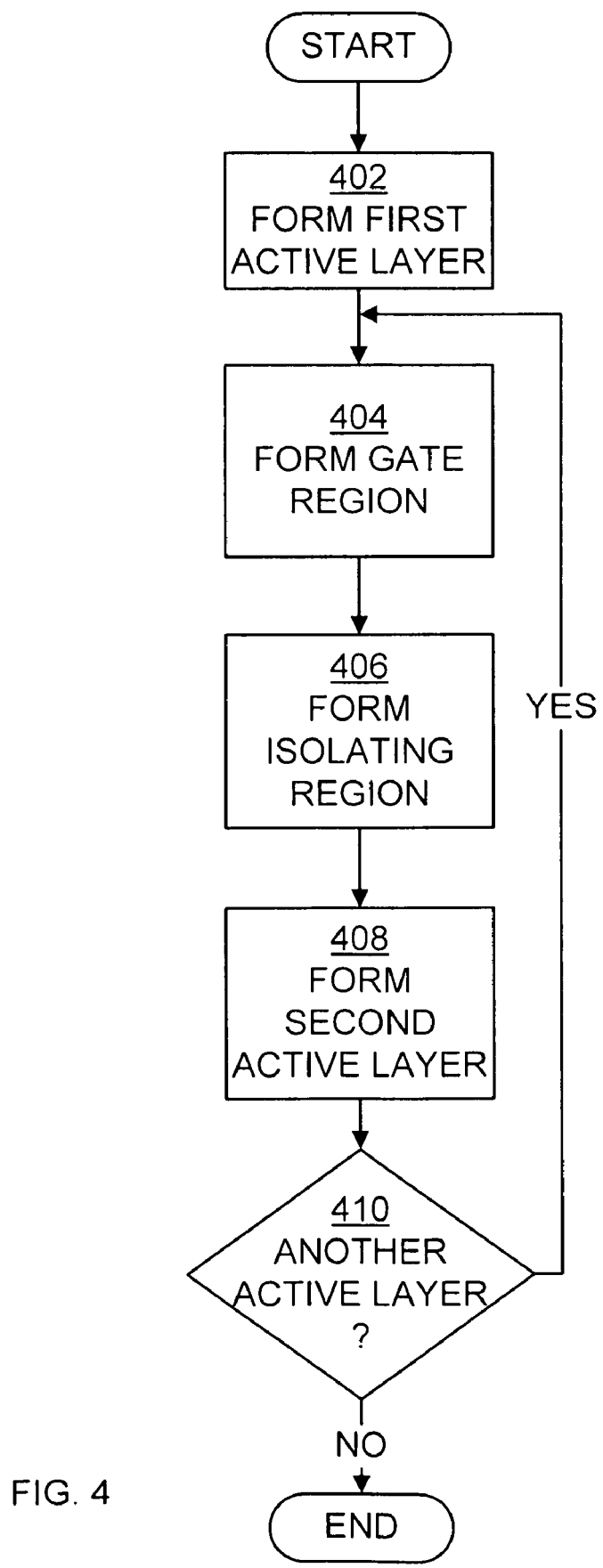
FIG. 4 is a flowchart showing one embodiment of a method of making a device according to FIG. 3.

Referring now to FIG. 4, in an embodiment of a method of fabricating a 3D-IC, in step 402 a first active layer 304, 320, 360 of components 306, 308, 310, 322, 324, 326, 362, 364,

366 is formed on a substrate 302, etc. The first active layer 304 may be formed by a suitable process, including conventional processes, and in the interests of conciseness the process of forming the first active layer is not described in detail.

In step 404, a first part 314, 352 of an insulating region 312, 350, which will constitute the gate insulator of an FET 324, 326 is formed over part of the first active layer 304, 320. As explained with reference to FIG. 3, the insulating region first part 314, 352 is formed appropriately so that the field from the gate electrode 310, 366 has the desired effect on the FET channel 332, 340.

In step 406, a second part 316 of the insulating region 312, which will isolate the active devices 306, 308 and other components of one active layer 304 from the active devices 322, 326 and other components of another active layer 320, is formed over part of the first active layer 304 that is not provided with an insulating region first part 314. The insulating region second part 316 may include thicker regions 356 as appropriate.

Although in FIG. 4 the step 404 is shown as taking place before the step 406, either may be carried out first. Where the gate region 314 and the isolating region 316 are formed from the same material, step 404 may comprise forming a thin insulating layer over the whole area of insulating region 312, and step 406 may comprise adding additional thickness to the isolating region 316.

In step 408, a second active layer 320 is formed on top of the insulating region 312. The second active layer 320 may be formed by applying a silicon or other semiconductor layer to the insulating region 312, and then fabricating the active devices and other components similarly to the first active layer 304. A monocrystalline silicon layer may be formed by depositing a layer of polycrystalline or amorphous silicon by a suitable process, including known processes, and then converting the polycrystalline or amorphous silicon to monocrystalline form. Amorphous silicon may be crystallized, or polycrystalline silicon may be recrystallized to monocrystalline silicon, by a laser heating process that anneals the silicon into a monocrystalline form, or locally melts the silicon and allows the silicon to crystallize or recrystallize about a single center. Such techniques are not usual in microprocessor fabrication but are known in the art of manufacturing flat-panel displays. Alternatively, a monocrystalline silicon layer may be formed by lateral epitaxial growth from a single center. In a practical embodiment, a crystalline silicon layer may be formed that has each active device formed in or on a single silicon crystal. Neighboring devices may be formed on the same crystal. However, crystal boundaries may occur between devices, and polycrystalline or amorphous regions may occur in locations with no active semiconductor devices.

In step 410, it is determined whether another active layer is to be added to the 3D-IC. If so, the process loops back to steps 404 and 406, to apply a further insulating region on top of the most recently formed active layer. The process then repeats as often as is necessary to form the required 3D structure. Once it is determined at step 410 that all of the active layers have been added, the process terminates.

The process shown in FIG. 4 may be followed by usual additional processes, for example, to attach external leads, package the IC device 20, 300, and so on.

Various modifications and variations can be made in the present invention without departing from the spirit or scope of the invention.

For example, in the interests of simplicity, the 3D-IC 300 shown in FIG. 3 and the process of fabricating such a 3D-IC shown in FIG. 4 are described with three active layers 302, 320, 360 separated by two insulating regions 312, 350. Each insulating region 312, 350 is shown as having one first part 314, 352 that separates a gate electrode of an FET 324, 326 in one active layer 302, 360 from a channel 332, 340 of the same FET 324, 326 in a neighboring layer 320. A practical embodiment may have two, three, or more than three active layers, and may have more than one FET 324, 326 transferring signals across the insulating region, or each of the insulating regions, between neighboring active layers. A practical embodiment may have FETs 324, 326 transferring signals in both directions across the insulating region between any two neighboring active layers.

Although FETs 34, 324, 326 with a single gate electrode in a layer adjacent to the layer with the channel 40, 332 340, and optionally one additional gate electrode 333 in the same layer as the channel 332, have been described, field effect devices with more than one or two gate or other control electrodes, or with differently arranged gate electrodes, are possible. For example, an FET 34, 324, 326 can be provided with two gate electrodes in the same active layer as the channel and/or two gate electrodes in the adjacent layer. Wherever a "gate" is shown or referred to, that gate may be multiple gates. Where the gate electrodes interact, the functions may be assigned to the different electrodes as appropriate for a specific use. An FET 324, 326 can be provided with the channel in one active layer 320, and with two gate electrodes 310, 366 in the adjacent active layers 304, 360 on both sides of the layer 320.

Although the devices 34, 324, 326 are described as FETs, a device having an element that is affected by a field from a nearby electrode may be used even if that device is not a transistor. Devices in which the conductivity of an active path is modulated capacitively by a field from a nearby electrode are especially suitable. Another example of an active device that may be used as the device 34, 324, 326 is a field emission device having a cathode (emitter) and an anode in one layer, with a gate in another layer controlling the current between the cathode and the anode.

The layers of the 3D-IC devices 20, 300 have been described as being grown or deposited onto previous layers. That is to say, the material of each layer after the first is built up starting with atoms or molecules bonded directly to the previous layer, and with subsequent atoms or molecules bonding to earlier atoms or molecules. An alternative process in which layers are fabricated separately as solid objects and then stacked together is possible in principle. However, at the present time the fine tolerances necessary for the FETs 34, 324, 326 are more easily achieved using a process of growth or deposition.

Although the 3D-IC devices 20, 300 are shown in FIGS. 1 and 3 as communicating between layers entirely by the capacitive field effect, a mixture of field effect communication and other forms of communication, which may include conductive communication through vias, contact pins, and the like may be used. Even where data communication between layers is entirely by the capacitive field effect, conductors may be provided for DC power, ground, and other connections that cannot be made capacitively.

In the interests of simplicity, the 3D-ICs 20, 300 have been described as oriented with the layers horizontal, as shown in vertical cross-section in FIGS. 1 and 3, and as being fabricated layer by layer in order from the bottom to the top. However, the 3D-ICs may be positioned in any orientation, and may be fabricated in a desired sequence, including a layer-by-layer sequence starting from a desired layer.

Thus, it is intended that the present invention cover the modifications and variations of this invention provided they come within the scope of the appended claims and their equivalents.

What is claimed is:

1. An integrated circuit comprising active devices in more than one active layer, wherein at least one first active device comprises a first conductor in one active layer and a first active element in an adjacent active layer, wherein the at least one first conductor is operative to produce a static electric field that controls the first active element.

2. An integrated circuit according to claim 1, wherein one of the said one active layer and the said adjacent active layer is grown or deposited onto the other of the said one active layer and the said adjacent active layer.

3. An integrated circuit according to claim 1, wherein the first active element and the first conductor form a field-effect device.

4. An integrated circuit according to claim 1, comprising an insulating region between the said one active layer and the said adjacent active layer.

5. An integrated circuit according to claim 4, wherein the insulating region comprises a first part operative to permit penetration of the static electric field from the first conductor to the controlled active element, and a second part operative to hinder field penetration between the said one active layer and the said adjacent active layer.

6. An integrated circuit according to claim 5, wherein the first part of the insulating region has at least one property selected from the group consisting of a higher permittivity than the second part of the insulating region and a smaller thickness than the second part of the insulating region.

7. An integrated circuit according to claim 1, further comprising a second active element that is controlled by a static electric field from a second conductor, wherein the second active component is in an active layer adjacent to an active layer containing the second conductor.

8. An integrated circuit according to claim 7, wherein the first and second conductors are on opposite sides of the respective first and second active elements in a direction transverse to the active layers.

9. Three-dimensional integrated circuit comprising transistors in more than one active layer, and further comprising at least one field-effect transistor of which the gate and the channel are in different active layers.

10. Three-dimensional integrated circuit according to claim 9, further comprising an insulating region between the active layers containing the gate and the channel, wherein a part of the insulating region between the gate and the channel is arranged to serve as a gate insulator of the at least one field-effect transistor and wherein another part of the insulating region is arranged to isolate the channels of transistors in at least one of the active layer containing the gate and the active layer containing the channel from the fields of conductors in the other of those active layers.

11. Three-dimensional integrated circuit according to claim 10, wherein the gate insulator has a higher permittivity than the isolating part of the insulating region.

12. Three-dimensional integrated circuit according to claim 10, wherein the gate insulator is thinner than the isolating part of the insulating region.

13. Three-dimensional integrated circuit according to claim 12, further comprising a second insulating region adjacent to one of said active layers containing the gate and the channel and a third transistor-containing active layer on the side of the second insulating region remote from said active layers containing the gate and the channel, wherein the second insulating region is thickened opposite the gate insulator to compensate for the thinness of the gate insulator.

14. Three-dimensional integrated circuit according to claim 9, further comprising at least one transistor with its gate in an active layer above its channel, and at least one transistor with its gate in an active layer below its channel.

15. Three-dimensional integrated circuit according to claim 9, wherein at least one said field effect transistor further comprises at least one additional gate in at least one of the active layer containing the channel and an active layer adjacent to the active layer containing the channel.

16. Three-dimensional integrated circuit according to claim 9, wherein one of the said different active layers is grown or deposited on the other of the said different active layers.

* * * * *